(12) United States Patent
Ono

(10) Patent No.: US 10,936,279 B2
(45) Date of Patent: Mar. 2, 2021

(54) RADIO COMMUNICATION DEVICE, RADIO COMMUNICATION METHOD, AND RECORDING MEDIUM

(71) Applicant: JVCKENWOOD Corporation, Yokohama (JP)

(72) Inventor: Yoshiteru Ono, Yokohama (JP)

(73) Assignee: JVCKENWOOD Corporation, Yokohama (JP)

( * ) Notice: Subject to any disclaimer, the term of this patent is extended or adjusted under 35 U.S.C. 154(b) by 0 days.

(21) Appl. No.: 16/718,227

(22) Filed: Dec. 18, 2019

(65) Prior Publication Data
US 2020/0201595 A1 Jun. 25, 2020

(30) Foreign Application Priority Data
Dec. 25, 2018 (JP) .............................. JP2018-240653

(51) Int. Cl.
*G06F 3/16* (2006.01)
*G10L 25/51* (2013.01)
*H04R 29/00* (2006.01)
*H04W 4/10* (2009.01)

(52) U.S. Cl.
CPC .............. *G06F 3/165* (2013.01); *G10L 25/51* (2013.01); *H04R 29/001* (2013.01); *H04W 4/10* (2013.01); *H04R 2430/01* (2013.01)

(58) Field of Classification Search
None
See application file for complete search history.

(56) References Cited

U.S. PATENT DOCUMENTS

| 2005/0152524 | A1* | 7/2005 | Carlson | H04M 3/56 379/202.01 |
| 2006/0098591 | A1* | 5/2006 | Katou | H04M 1/72522 370/260 |
| 2008/0037749 | A1* | 2/2008 | Metzger | H04M 3/568 379/202.01 |
| 2011/0044474 | A1* | 2/2011 | Grover | H04R 27/00 381/107 |

FOREIGN PATENT DOCUMENTS

JP 2016-012764 1/2016

* cited by examiner

*Primary Examiner* — James K Mooney
(74) *Attorney, Agent, or Firm* — Amin, Turocy & Watson, LLP

(57) ABSTRACT

A radio communication device is a radio communication device that performs radio communication by a press-to-talk communication system, and includes an operating unit that receives an operation of a user, an output unit that outputs a received voice signal as a voice, and a volume adjusting unit that adjusts a volume of the voice output by the output unit. The volume adjusting unit acquires source information that indicates a source of the voice signal when a predetermined operation by a user is made with respect to the operating unit, and adjusts the volume of the voice by using an adjustment coefficient that is a degree of adjustment of the volume of the voice, based on the acquired source information.

6 Claims, 10 Drawing Sheets

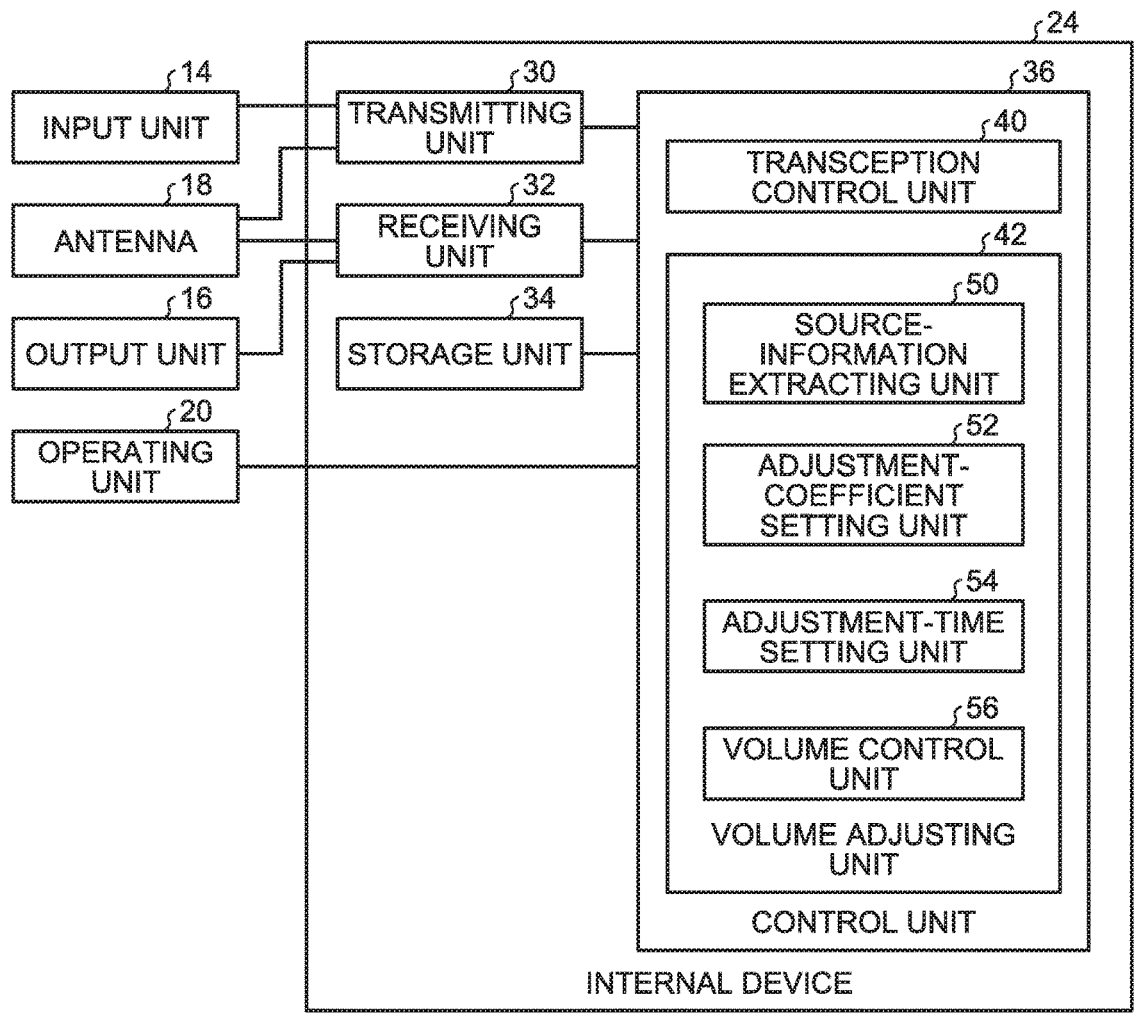

RADIO COMMUNICATION DEVICE, RADIO COMMUNICATION METHOD, AND RECORDING MEDIUM

CROSS-REFERENCE TO RELATED APPLICATIONS

This application claims priority from Japanese Application No. 2018-240653, filed on Dec. 25, 2018, the contents of which are incorporated by reference herein in its entirety.

BACKGROUND

1. Technical Field

The present disclosure relates to a radio communication device, a radio communication method, and a recording medium.

2. Description of the Related Art

Radio communication devices that perform radio communications by a press-to-talk communication system transmit a voice only while a push to talk (PTT) switch is operated, but receive a voice automatically without the switch being operated. Accordingly, depending on a situation of a user, it is sometimes necessary to adjust the voice from the radio communication device. For example, under a circumstance when there is something that should be prioritized over listening to a voice from the radio communication device, such as during attendance to a customer, or under a circumstance when it is desirable that a voice should not be heard by people around, there are needs for setting the volume low. Moreover, under a circumstance when there is a possibility of receiving important information, there are also needs for setting the volume high. Japanese Patent No. 6314693 describes that the volume is lowered until communication is ended, by pressing the PTT switch in short pressing multiple times.

There is a case in which the radio communication device receives voices in different timing from multiple users. In this case, if the volume is lowered irrespective of a situation, for example, as in Japanese Patent No. 6314693, it can cause a failure to receive information appropriately, such as a case of missing important information. Thus, there has been a demand for more flexible volume adjustment of the radio communication device.

SUMMARY

It is an object of the present disclosure to at least partially solve the problems in the conventional technology.

A radio communication device according to one embodiment of the present disclosure that performs radio communication by press-to-talk communication system is disclosed. The device includes an operating unit that receives an operation by a user, an output unit that output a received voice signal as a voice, and a volume adjusting unit that adjusts a volume of the voice that is output by the output unit. The volume adjusting unit acquires source information indicating a source of the voice signal when a predetermined operation by the user is made with respect to the operating unit, and adjusts the volume of the voice by using an adjustment coefficient that indicates a degree of adjustment of the volume of the voice, based on the acquired source information.

A radio communication method according to one embodiment of the present disclosure to perform radio communication by a press-to-talk communication system by using an operating unit that receives an operation by a user, and a radio communication device that outputs a received voice signal as a voice is disclosed. The method includes acquiring source information that indicates a source of the voice signal when a predetermined operation by the user is made with respect to the operating unit, and adjusting a volume of the voice by using an adjustment coefficient that is a degree of adjustment of the volume of the voice, based on the acquired source information.

A non-transitory computer readable recording medium according to one embodiment of the present disclosure storing therein a computer program that causes a computer to execute a radio communication method for performing radio communication by a press-to-talk communication system by using an operating unit that receives an operation of a user, and a radio communication device that outputs a received voice signal as a voice is disclosed. The program causes the computer to execute acquiring source information that indicates a source of the voice signal when a predetermined operation by the user is made with respect to the operating unit, and adjusting a volume of the voice by using an adjustment coefficient that is a degree of adjustment of the volume of the voice, based on the acquired source information.

The above and other objects, features, advantages and technical and industrial significance of this disclosure will be better understood by reading the following detailed description of presently preferred embodiments of the disclosure, when considered in connection with the accompanying drawings.

BRIEF DESCRIPTION OF THE DRAWINGS

FIG. 2 is a block diagram illustrating a configuration of an internal device according to the present embodiment;

FIG. 3 illustrates an example of an adjustment information table according to the present embodiment;

DETAILED DESCRIPTION OF THE PREFERRED EMBODIMENTS

Hereinafter, embodiments of the present disclosure will be described in detail with reference to the drawings. The embodiments described below are not intended to limit the present disclosure.

Configuration of Radio Communication Device

Figure 1:
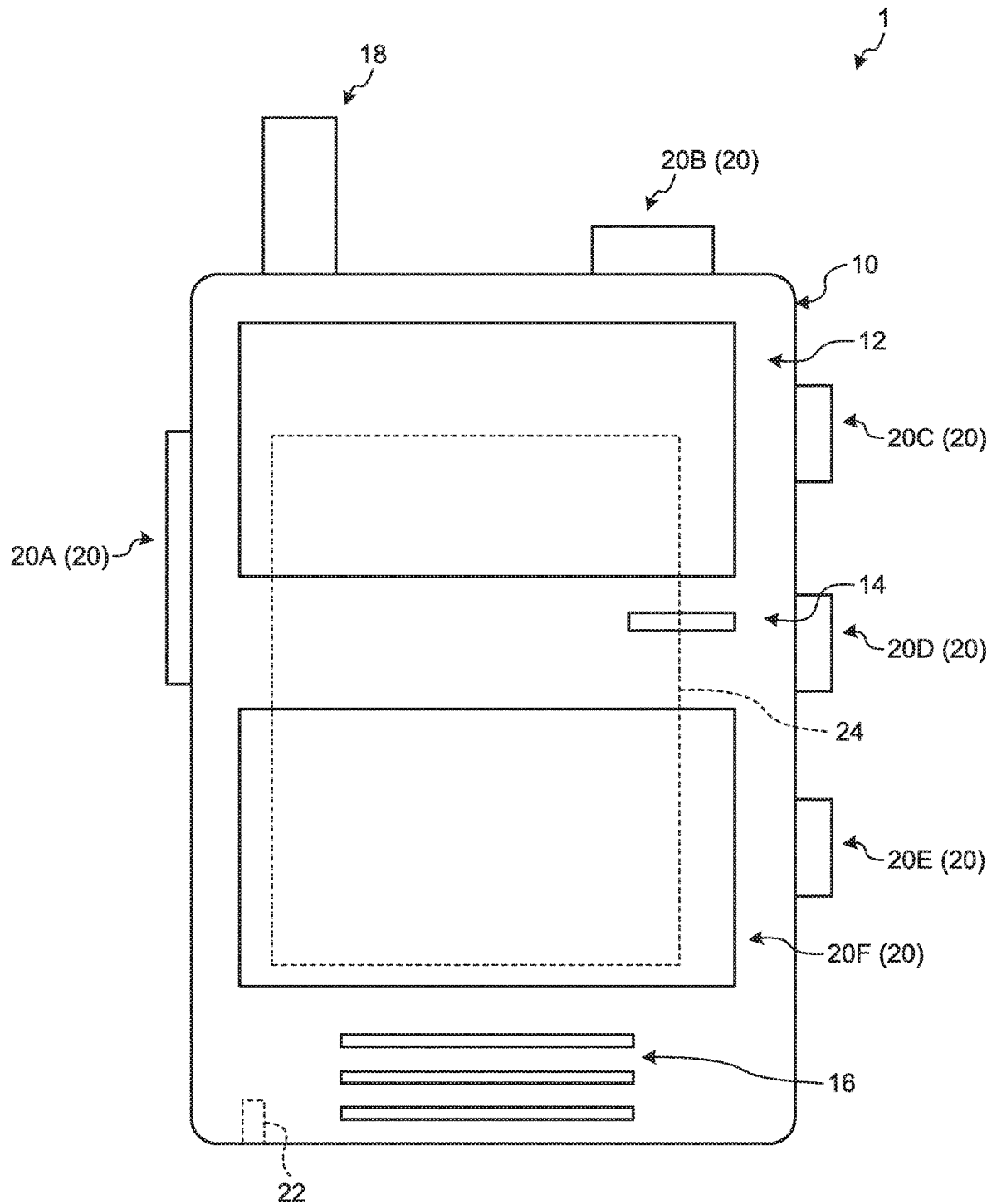
FIG. 1 is a schematic diagram of a radio communication device according to a present embodiment.

FIG. 1 is a schematic diagram of a radio communication device according to a present embodiment. As illustrated in FIG. 1, a radio communication device 1 according to the present embodiment includes a casing 10, a display unit 12, an input unit 14, an output unit 16, an antenna 18, a PTT switch 20A, a volume operating unit 20B, a switches 20C, 20D, 20E, an operating button 20F, a connecting unit 22, and an internal device 24. The radio communication device 1 is a terminal that performs radio communication by the press-to-talk communication system. That is, the radio communication device 1 transmits a voice collected from the input unit 14 as an electric wave only while the PTT switch 20A is pressed.

The casing 10 is a main body of the radio communication device 1, and houses the internal device 24 thereinside. The display unit 12 is provided on a surface 10a of the casing 10, and is a display screen of, for example, a liquid crystal panel, or the like. However, the radio communication device 1 may be configured without the display unit 12. The input unit 14 is provided on the surface 10a of the casing 10, and is a microphone to which a voice from a user of the radio communication device 1 is input. The output unit 16 is provided on the surface 10a of the casing 10, and is a speaker that outputs a voice received by radio communication. Note that the positions at which the input unit 14 and the output unit 16 are provided are not limited to the surface 10a of the casing 10, but may be any positions. The antenna 18 is provided on an upper surface 10b of the casing 10. The radio communication device 1 performs radio communication with another radio communication device through the antenna 18. That is, the antenna 18 receives a signal from the other radio communication device as a reception signal. Moreover, the antenna 18 transmits a transmission signal, which is a signal transmitted from the radio communication device 1. Note that the position at which the antenna 18 is provided may also be any position.

The PTT switch 20A is provided on a side surface 10c of the casing 10. The PTT switch 20A is a button that is operated by the user when a voice from the user is transmitted as a transmission signal from the radio communication device 1. As the user operates, herein presses, the PTT switch 20A, a PTT signal, which is a control signal indicating a start of transmission, is transmitted. Furthermore, the position at which the PTT switch 20A is provided is also not limited to the side surface 10c, but may be any position.

The volume operating unit 20B is provided on the upper surface 10b of the casing 10. A volume operating unit 20B is a lever to adjust volume of a voice output from the output unit 16. Moreover, the volume operating unit 20B may have a lever to change frequencies for radio communication. The position at which the volume operating unit 20B is provided is not limited to the upper surface 10B, but may be any position. Note that the volume according to the present embodiment can translate into a ratio of loudness of an output voice with respect to a loudness of a sound included in a voice signal when the voice signal including information of predetermined loudness of a sound is output as a voice. Therefore, even if it is set to the same volume, a voice output when a sound included in a voice signal is large is to be larger than a voice output when a sound included in a voice signal is small.

The switches 20C, 20D, 20E are provided on a side surface 10d of the casing 10. Being operated, herein pressed, by the user, the switches 20C, 20D, 20E cause the internal device 24 to perform predetermined processing. In the present embodiment, the switch 20C is an operating unit to make an adjustment operation to be a trigger of volume adjustment described later. Moreover, the switch 20D is an operating unit to perform extension operation to be a trigger of extending the volume adjustment. Furthermore, the switch 20E is an operating unit to perform a stop operation to be a trigger of stopping the volume adjustment. Note that the positions of the switch 20C (the operating unit to perform adjustment operation), the switch 20D (the operating unit to perform the extension operation), and the switch 20E (the operating unit to perform the stop operation) may be at any positions and are not limited to the side surface 10d of the casing 10. Moreover, the switch 20C (the operating unit to perform adjustment operation), the switch 20D (the operating unit to perform the extension operation), and the switch 20E (the operating unit to perform the stop operation) are separate switches in the present embodiment, but may also be, for example, the same switch. However, it is preferable that the switch 20C (the operating unit to perform adjustment operation), the switch 20D (the operating unit to perform the extension operation), and the switch 20E (the operating unit to perform the stop operation) be a separate switch from the PTT switch 20A.

The operating button 20F is provided on the surface 10a of the casing 10. The operating button 20F has plural keys to be operated by a user, such as keys in a ten-key pad and numeric keys.

As described, the PTT switch 20A, the volume operating unit 20B, the switch 20C (the operating unit to perform adjustment operation), the switch 20D (the operating unit to perform the extension operation), the switch 20E (the operating unit to perform the stop operation), and the operating button 20F can be regarded as an operating unit that receives operations of a user. The PTT switch 20A, the volume operating unit 20B, the switch 20C (the operating unit to perform adjustment operation), the switch 20D (the operating unit to perform the extension operation), the switch 20E (the operating unit to perform the stop operation), and the operating button 20F are referred to as an operating unit 20, when these are not distinguished from one another. Note that the operating unit 20 may be in any form as long as it is operated by a user, and the form thereof is not limited to the structures of button, lever, and key.

The connecting unit 22 is provided on a lower surface 10e at a lower portion of the casing 10. The connecting unit 22 is a connecting terminal to which an output device that is capable of voice output, such as an earphone, an input device that is capable of voice input, such as a microphone, and further, an operating device having a function of the operating unit 20 can be connected. That is, when an output device such as an earphone is connected to the connecting unit 22, the output device that is connected to the connecting unit 22 constitutes an output unit that outputs a voice received by the radio communication. Moreover, when an input device, such as a microphone, is connected to the connecting unit 22, the input device connected to the connecting unit 22 constitutes an input unit to which a voice from the user of the radio communication device 1 is input.

Hereinafter, unless otherwise particularly specified, the output unit 16 denotes at least one of the output unit 16 and an output device that is connected to the connecting unit 22. Similarly, unless otherwise particularly specified, the input unit 14 denotes at least one of the input unit 14 and an input device that is connected to the connecting unit 22. Note that the position at which the connecting unit 22 is provided is also not limited to the lower surface 10e, but may be any position.

FIG. 2 is a block diagram illustrating a configuration of the internal device according to the present embodiment. The internal device 24 is arranged inside the casing 10, and includes, as illustrated in FIG. 2, a transmitting unit 30, a receiving unit 32, a storage unit 34, and a control unit 36. The transmitting unit 30 is a circuit that is controlled by a transception control unit 40 described later to convert a voice input to the input unit 14 into a transmission signal. The receiving unit 32 is a circuit that is controlled by the transception control unit 40 described later to decode a reception signal received from the antenna 18, to generate a voice signal.

The storage unit 34 is a memory that stores calculation results or a program of the control unit 36, information of an adjustment information table described later, and the like, and includes, for example, at least one of a random access memory (RAM), a read-only memory (ROM), and an external storage device such as a hard disk drive (HDD).

The control unit 36 is an arithmetic unit, namely, a central processing unit (CPU). As illustrated in FIG. 2, the control unit 36 includes the transception control unit 40, and a volume adjusting unit 42. The transception control unit 40 and the volume adjusting unit 42 are implemented by the control unit 36 reading software (program) stored in the storage unit 34, and perform processing described later. Note that at least the transception control unit 40 is not limited to be a program, but may be hardware, such as a circuit that performs the processing described later.

The transception control unit 40 causes the output unit 16 to output the reception signal received by the antenna 18 as a voice. Specifically, when the PTT switch 20A is not operated by the user, that is, when a PTT signal has not been acquired, the transception control unit 40 maintains the radio communication device 1 in a reception state, that is, a state being capable of outputting a reception signal as a voice. That is, the transception control unit 40 intermittently becomes the reception state. The transception control unit 40 causes the receiving unit 32 to decode a reception signal received from the antenna 18 in the reception state as a voice signal. The transception control unit 40 acquires the voice signal decoded by the receiving unit 32, and extracts source information, destination information, and a voice information signal from the voice signal. That is, the voice signal includes the source information, the destination information, and the voice information signal.

The source information is information indicating a source of the voice signal (reception signal). That is, the source information is identification (ID) information that indicates from which user or which radio communication device the voice signal has been transmitted. The source information can be regarded as a source identifier that enables to identify a source. Moreover, the destination information is information that indicates to which of the radio communication device 1 the voice signal is intended to be delivered. That is, the destination information can be regarded as ID information that indicates to which user or which radio communication device the voice signal is directed. The destination information can be regarded as a destination identifier enabling to identify a destination. Note that when a voice signal is transmitted to multiple radio communication devices at the same time, that is, when transmitted to a group including multiple radio communication devices in simultaneous transmission, the destination information may be information indicating the group.

The voice information signal is a signal including information of a voice included in the voice signal (reception signal). The transception control unit 40 determines whether to output the voice information signal as a voice based on the source information. Having determined to output as a voice, the transception control unit 40 transmits the voice information signal to the output unit 16, to cause the output unit 16 to output it as a voice. Having determined not to output as a voice, the transception control unit 40 does not cause the voice information signal to be output as a voice. Note that, for example, when the destination indicated in the destination information includes the radio communication device 1 itself, or when the group of destination indicated in the destination information includes the radio communication device 1 itself, the transception control unit 40 determines to output the voice information signal as a voice.

Moreover, the transception control unit 40 controls the transmitting unit 30 to output a transmission signal. Specifically, when the PTT switch 20A is operated by the user, that is, when a PTT signal is acquired, the transception control unit 40 converts a voice input to the input unit 14 into a voice information signal. When the PTT switch 20A is operated by the user, that is, when the PTT signal is acquired, the transception control unit 40 maintains the radio communication device 1 in the transmission state, that is, a state being capable of transmitting a voice as a transmission signal. More specifically, in the transmission state, the transception control unit 40 encodes the voice input to the input unit 14 together with the source information indicating the radio communication device 1 of itself, and the destination information, to generate a voice signal including a voice information signal, a source signal, and a destination signal. The transception control unit 40 causes the transmitting unit 30 to convert the generated voice signal into a transmission signal of a predetermined frequency, and to output the transmission signal from the antenna 18. Note that the source information indicating the radio communication device 1 of itself is source information that indicates that it is transmitted by the radio communication device 1 or a user of the radio communication device 1. Moreover, the destination information is set by, for example, the user.

The volume adjusting unit 42 adjusts the volume of a voice output by the output unit 16. The volume adjusting unit 42 controls, for example, an amplifier connected to the output unit 16, to thereby adjust the volume of a voice output by the output unit 16. The volume adjusting unit 42 performs volume adjustment processing described later when a predetermined operation by a user is made with respect to the operating unit 20. The predetermined operation is an adjustment operation to be a trigger for volume adjustment, and in the present embodiment, it is an operation with respect to the switch 20C. The adjustment operation is, for example, an operation to press the switch 20C one time, but how the operation for the adjustment operation is done is not limited to pressing one time, but is done by any form.

The volume adjusting unit 42 includes a source-information acquiring unit 50, an adjustment-coefficient setting unit 52, an adjustment-time setting unit 54, and a volume control unit 56. The source-information acquiring unit 50 acquires the source information of the reception signal received by the antenna 18, that is, the voice signal that is received and decoded by the receiving unit 32 when the adjustment operation is made with respect to the switch 20C. That is, the source-information acquiring unit 50 acquires the source information that is extracted from the voice signal by the transception control unit 40.

When the adjustment operation is made with respect to the switch 20C, the adjustment-coefficient setting unit 52 sets an adjustment coefficient that is a degree of adjustment of the volume of a voice output by the output unit 16 based on the source information acquired by the source-information acquiring unit 50. In more detail, when a volume preset as the volume of the voice output by the output unit 16 is regarded as a regular volume, the adjustment coefficient can be regarded as a coefficient by which the regular volume is multiplied. In this case, an adjusted volume that is a value obtained by multiplying the regular volume by the adjustment coefficient is the volume of the voice to be actually output by the output unit 16. In the present embodiment, the adjustment coefficient is set within a numeric range larger than 0 and smaller than 1, but it is not limited thereto, and may be set within an arbitrary numeric range. For example, the adjustment coefficient may be set to a value larger than 1. Moreover, the preset regular volume is set by, for example, operating the volume operating unit 20B by the user. As described, the adjustment coefficient can be regarded as a coefficient to perform the volume adjustment for the volume of a voice output by the output unit 16 when the adjustment operation is made with respect to the switch 20C.

FIG. 3 illustrates an example of an adjustment information table according to the present embodiment. The storage unit 34 stores the adjustment information table. The adjustment information table is a set of information that includes multiple pieces of adjustment information in which the source information and the adjustment coefficient are associated with each other. That is, the storage unit 34 stores the adjustment information that is information in which the source information and the adjustment coefficient are associated with each other for each of the multiple pieces of the source information. The adjustment-coefficient setting unit 52 sets the adjustment coefficient based on the adjustment information table, that is, multiple pieces of the adjustment information. As illustrated in FIG. 3, with the adjustment information, adjustment time is also associated, but the adjustment time will be described later. Detailed description is omitted, but the adjustment information may be a table in which, instead of the source information, the destination group information is associated with the adjustment coefficient and the adjustment time, and associated information is stored. As described above, the transception control unit 40 outputs a voice when the destination information indicates a group and the radio communication device 1 of itself is included therein. Because the radio communication device 1 can belong to multiple groups, by using the destination group information included in the adjustment information table, volume adjustment according to a difference of the group can be performed.

As illustrated in FIG. 3, the adjustment information table includes the adjustment information in which the source information and the adjustment coefficient are associated with each other, for every source information. That is, in the adjustment information table, the adjustment coefficient is assigned to each of the source information, and may take a different value for each source information. In the example in FIG. 3, to source information A1, adjustment coefficient B1 is assigned, to source information A2, adjustment coefficient B2 is assigned, and to source information A3, adjustment coefficient B3 is assigned. The source information A1 is, for example, information indicating that the source is a radio communication device P1, the source information A2 is, for example, information indicating that the source is a radio communication device P2 different from the radio communication device P1, and the source information A3 is, for example, information indicating that the source is a radio communication device P3 different from the radio communication devices P1 and P2. FIG. 3 illustrates that example in which to the three pieces of the source information A1, A2, A3, the adjustment coefficients B1, B2, B3 are respectively assigned, but the number of pieces of the source information to which the adjustment coefficient is assigned, that is, the number of pieces of the adjustment information is not limited to three, but may be arbitrary number. Furthermore, in FIG. 3, to default source information A0, a default adjustment coefficient B0 is assigned. The default source information A0 indicates all of sources except source information included in the adjustment information table. That is, the default source information A0 indicates all of the sources except the source information that is set as the adjustment information, and the example in FIG. 3 indicates that radio communication devices other than the radio communication devices P1, P2, P3 are the sources. Furthermore, the default adjustment coefficient B0 is the adjustment coefficient B assigned to the default source information A0. Hereinafter, when the default source information A0 and the source information A1, A2, A3 are not distinguished from one another, it is referred to as source information A, and when the default adjustment coefficient B0 and the adjustment coefficients B1, B2, B3 are not distinguished from one another, it is referred to as an adjustment coefficient B.

The source information A and the adjustment coefficient B in the adjustment information table are set in advance and stored in the storage unit 34. The source information A and the adjustment coefficient B in the adjustment information table may be set by, for example, the user. That is, for example, the source information A is selected by the user, and the adjustment coefficient B to be associated with the selected source information A is set. In this case, for example, the user may set the source information A and the adjustment coefficient B by operating the operation button 20F, or the like. Moreover, the source information A and the adjustment coefficient B may be set, for example, by the radio communication device 1 acquiring the source information A and the adjustment coefficient B through radio communication. That is, the source information A included in the adjustment information table can be arbitrarily set, and a value of the adjustment coefficient B associated with the source information A can also be arbitrarily set.

The adjustment-coefficient setting unit 52 sets the adjustment coefficient B based on the adjustment information table thus set. That is, the adjustment-coefficient setting unit 52 acquires the source information A of the received voice from the source-information acquiring unit 50, and reads the adjustment information table from the storage unit 34. The adjustment-coefficient setting unit 52 then checks the source information A of the received voice signal against the adjustment information table, to detect whether the source information A that matches with the source information A of the received voice signal is present among the source information A included in the adjustment information table. The source information A included in the adjustment information table herein means the source information A excluding the default source information A0 out of the source information A included in the adjustment information table, and in the example of FIG. 3, it corresponds to the source information A1, A2, and A3. When the source information A that matches with the source information A of the received voice signal is included in the adjustment information table, the adjustment-coefficient setting unit 52 extracts the adjustment coefficient B that is associated with the source information A matching with the source information A of the received voice signal. The adjustment-coefficient setting unit 52 sets the extracted adjustment coefficient B to the adjustment coefficient B to be used for voice adjustment of the received voice signal. For example, when the source information A of the received voice signal is the source information A1, that is, when the received voice signal is from the radio communication device P1, the adjustment-coefficient setting unit 52 sets the adjustment coefficient B1 that is associated with the source information A1 included in the adjustment information table to the adjustment coefficient B of the received voice signal.

Furthermore, when the source information A that matches with the source information A of the received voice signal is not included in the adjustment information table, that is, when the source information A of the received voice signal does not match with any of the source information A except the default source information A0, the adjustment-coefficient setting unit 52 extracts the default adjustment coefficient B0 that is associated with the default source information A0. The adjustment-coefficient setting unit 52 sets the extracted default adjustment coefficient B0 to the adjustment coefficient B to be used for voice adjustment of the received voice signal. For example, when the source information A of the received voice signal does not match with any of the source information A1, A2, A3, that is, the received voice signal is not from any of the radio communication devices P1, P2, P3, the adjustment-coefficient setting unit 52 sets the default adjustment coefficient B0 associated with the default source information A0 to the adjustment coefficient B to be used for voice adjustment of the received voice signal. The adjustment-coefficient setting unit 52 thus sets the adjustment coefficient B.

Duration of the volume adjustment performed for a voice output by the output unit 16 is referred to as adjustment duration time. That is, the adjustment duration time is time for which the volume control unit 56 described later keeps performing the volume adjustment of an output voice of the output unit 16 by using the adjustment coefficient B. In other words, the volume control unit 56 performs the volume adjustment of a voice when the voice is output in a time period in the during the adjustment duration time. On the other hand, the volume control unit 56 does not perform the volume adjustment of a voice when the voice is output in a time period that is not in the adjustment duration time. The adjustment-time setting unit 54 illustrated in FIG. 2 sets, when an adjustment operation is made with respect to the switch 20C, adjustment time based on the source information acquired by the source-information acquiring unit 50. The adjustment time is time to set the adjustment duration time. As illustrated in FIG. 3, the adjustment time is associated with the source information A together with the adjustment coefficient B in the adjustment information. That is, the adjustment information in the adjustment information table is information in which the source information A, the adjustment coefficient B, and the adjustment time are associated with one another. As described, the storage unit 34 stores the adjustment time to set the adjustment duration time as the adjustment information, and the adjustment time is associated with the source information. The adjustment-time setting unit 54 sets the adjustment time based on the adjustment information table, that is, the adjustment information. Note that the adjustment time can be set to unlimited duration, and in this case, it is continued until a stop operation is made by the user.

As illustrated in FIG. 3, the adjustment information table includes the adjustment information in which the source information, the adjustment coefficient, and the adjustment time are associated with one another, per source information. That is, in the adjustment information table, the adjustment time is assigned to each source information, and may take a different value for each source information. In the example of FIG. 3, adjustment time $\Delta T1$ is assigned to the source information A1, adjustment time $\Delta T2$ is assigned to the source information A2, and adjustment time $\Delta T3$ is assigned to the source information A3. Although FIG. 3 illustrates an example in which the adjustment time $\Delta T1$, $\Delta T2$, and $\Delta T3$ are assigned to three pieces of the source information A1, A2, and A3, respectively, the number of pieces of the source information to which the adjustment time is assigned, that is, the number of pieces of the adjustment time, is not limited to three, but may be any number. Moreover, in FIG. 3, the default adjustment time $\Delta T0$ is assigned to the default source information A0. Hereinafter, when the default adjustment time $\Delta T0$ and the adjustment times $\Delta T1$, $\Delta T2$, $\Delta T3$ are not distinguished from one another, it is referred to as adjustment time $\Delta T$.

The source information A, the adjustment coefficient B, and the adjustment time $\Delta T$ in the adjustment information table are set in advance and stored in the storage unit 34. The source information A, the adjustment coefficient B, and the adjustment time $\Delta T$ in the adjustment information table may be set, for example, by the user. Specifically, for example, the source information A is selected by the user, and the adjustment coefficient B and the adjustment time $\Delta T$ to be associated with the selected source information A are set. In this case, the user can set the source information A, the adjustment coefficient B, and the adjustment time $\Delta T$, for example, by operating the operating button 20F, or the like. Moreover, the source information A, the adjustment coefficient B, and adjustment time $\Delta T$ may be set, for example, by the radio communication device 1 acquiring the source information A, the adjustment coefficient B, and the adjustment time $\Delta T$ through radio communication. As described, the source information A included in the adjustment information table is arbitrarily set, and values of the adjustment coefficient B and the adjustment time $\Delta T$ to be associated with the source information A are also arbitrarily set.

The adjustment-time setting unit 54 sets the adjustment time $\Delta T$ used for the adjustment duration time, based on the adjustment information table thus set. That is, the adjustment-time setting unit 54 acquires the source information A of the received voice signal from the source-information acquiring unit 50, and reads the adjustment information table from the storage unit 34. The adjustment-time setting unit 54 then checks the source information A of the received voice signal against the adjustment information table, to detect whether the source information A that matches with the source information A of the received voice signal is present among the source information A included in the adjustment information table. The source information A included in the adjustment information table herein means the source information A excluding the default source information A0 out of the source information A included in the adjustment information table. When the source information A that matches with the source information A of the received voice signal is included in the adjustment information table, the adjustment-time setting unit 54 extracts the adjustment time $\Delta T$ that is associated with the source information A matching with the source information A of the received voice signal. The adjustment-time setting unit 54 sets the extracted adjustment time ΔT to the adjustment time ΔT to be used for the adjustment duration time. For example, when the source information A of the received voice signal is the source information A1, that is, when the received voice signal is from the radio communication device P1, the adjustment-time setting unit 54 sets the adjustment time ΔT1 that is associated with the source information A1 included in the adjustment information table to the adjustment time ΔT to be used to set the adjustment duration time.

Furthermore, when the source information A that matches with the source information A of the received voice signal is not included in the adjustment information table, that is, when the source information A of the received voice signal does not match with any of the source information A except the default source information A0, the adjustment-time setting unit 54 extracts the default adjustment time ΔT0 that is associated with the default source information A0. The adjustment-time setting unit 54 uses the extracted default adjustment time ΔT0 for the voice adjustment of the received voice signal. For example, when the source information A of the received voice signal does not match with any of the source information A1, A2, A3, that is, the received voice signal is not from any of the radio communication devices P1, P2, P3, the adjustment-time setting unit 54 sets the default adjustment time ΔT0 associated with the default source information A0 to the adjustment time ΔT to be used to set the adjustment duration time. Moreover, the adjustment-time setting unit 54 also sets the default adjustment time ΔT0 associated with the default source information A0 to the adjustment time ΔT used to set the adjustment duration time also when an adjustment operation is made with respect to the switch 20C but no voice signal is received, determining that it does not match with any of the source information A except the default source information A0.

The volume control unit 56 illustrated in FIG. 2 adjusts the volume of the voice output by the output unit 16 by using the adjustment coefficient B set by the adjustment-coefficient setting unit 52. That is, the volume control unit 56 calculates an adjusted volume by multiplying the preset regular volume by the adjustment coefficient B set by the adjustment-coefficient setting unit 52. The volume control unit 56 causes the output unit 16 to output the received voice information signal as a voice in the adjusted volume.

Moreover, the volume control unit 56 sets the adjustment duration time that is time for which the volume adjustment is continued, by using the adjustment time ΔT set by the adjustment-time setting unit 54. That is, the volume control unit 56 sets the adjustment duration time such that the volume adjustment is continued as long as the adjustment time ΔT. It is noted that the volume control unit 56 varies the adjustment duration time from the adjustment time ΔT by condition. Details of a method of setting the adjustment duration time will be described in a flowchart described below. As described, the radio communication device 1 according to the present embodiment sets the adjustment duration time based on the adjustment time ΔT. However, the radio communication device 1 is not necessarily required to set the adjustment duration time. In this case, the volume control unit 56 may continue the volume adjustment for predetermined period of time, or may continue the volume adjustment until a stop operation is made with respect to the switch 20E. When the adjustment duration time is not set, the radio communication device 1 may also omit the setting of the adjustment time ΔT, and the adjustment time ΔT may be absent in the adjustment information illustrated in FIG. 3. That is, the radio communication device 1 only needs to set at least the adjustment coefficient B based on the source information A, and to adjust the volume of a voice by using the set adjustment coefficient B.

Settings of Adjustment Coefficient and Adjustment Duration Time

Next, a method of setting the adjustment coefficient B and the adjustment duration time by the volume adjusting unit 42 will be described. The volume adjusting unit 42 sets the adjustment coefficient and the adjustment duration time when an adjustment operation with respect to the switch 20C by the user is detected during when a volume adjustment flag is OFF. The volume adjustment flag is information that indicates necessity of the volume adjustment. As described later, when the volume adjustment flag is OFF, that is, when it is false, the volume adjusting unit 42 does not perform the volume adjustment. On the other hand, when the adjustment flag is ON, that is, when it is true, the volume adjusting unit 42 performs the volume adjustment.

Figure 4:
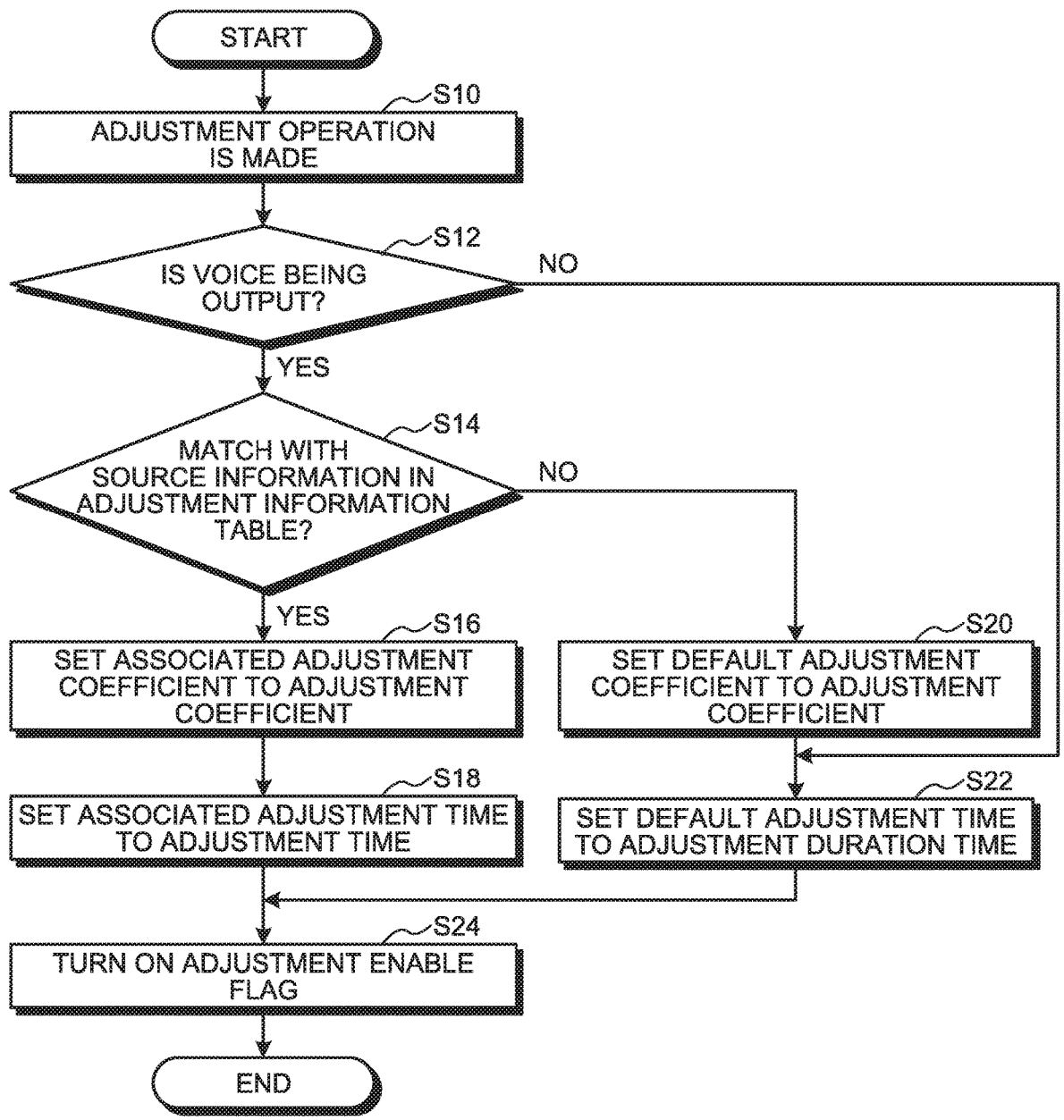
FIG. 4 is a flowchart explaining a method of setting an adjustment coefficient and an adjustment duration time.

FIG. 4 is a flowchart explaining a method of setting the adjustment coefficient and the adjustment duration time. As illustrated in FIG. 4, the volume adjusting unit 42 detects that an adjustment operation is made when the adjustment operation with respect to the switch 20C is made during when the volume adjustment flag is off (step S10), that is, when a volume adjustment event occurs. When detecting that an adjustment operation is made, the volume adjusting unit 42 determines whether a voice is being output from the output unit 16 (step S12). That is, the volume adjusting unit 42 determines whether the output unit 16 is outputting the received voice signal as a voice at the time when the adjustment operation is made with respect to the switch 20C.

When the voice is being output (step S12: YES), the volume adjusting unit 42 acquires the source information A of the voice signal being received by the source-information acquiring unit 50, and determines whether the acquired source information A matches with the source information A in the adjustment information table (step S14). That is, when the voice is being output, the source-information acquiring unit 50 acquires the source information A of the voice signal corresponding to the voice being output. The volume adjusting unit 42 then determines whether the source information A that matches with the source information A of the voice signal corresponding to the voice being output is present in the source information A included in the adjustment information table. When the matching source information A is present (step S14: YES), the volume adjusting unit 42 sets the adjustment coefficient B that is associated with the matching source information A by the adjustment-coefficient setting unit 52 as the adjustment coefficient B to be used for the volume adjustment (step S16). The volume adjusting unit 42 then sets the adjustment time ΔT that is associated with the matching source information A by the adjustment-time setting unit 54 as the adjustment time ΔT to be used to set the adjustment duration time, and sets the adjustment time ΔT to the adjustment duration time (step S18). That is, the adjustment-coefficient setting unit 52 sets the adjustment coefficient B that is associated with the source information A matching with the source information A of the voice signal corresponding to the voice being output in the adjustment information table, to the adjustment coefficient B to be used for the volume adjustment. The adjustment-time setting unit 54 sets the adjustment time ΔT that is associated with the source information A matching with the source information A of the voice signal corresponding to the voice being output in the adjustment information table, to the adjustment duration time. The adjustment-time setting unit 54 starts a timer of the adjustment duration time. That is, the adjustment-time setting unit 54 starts counting until the set adjustment duration time elapses. Note that the order of the step S16 and step S18 is not limited to this order, but may be in arbitrary order.

On the other hand, when the matching source information A is not present (step S14: NO), the volume adjusting unit 42 sets the default adjustment coefficient B0 as the adjustment coefficient B to be used for the volume adjustment by the adjustment-coefficient setting unit 52 (step S20). The volume adjusting unit 42 causes the adjustment-time setting unit 54 to set the default adjustment time ΔT0 as the adjustment time ΔT to be used to set the adjustment duration time, and sets the adjustment time ΔT to the adjustment duration time (step S22). That is, the adjustment-coefficient setting unit 52 and the adjustment-time setting unit 54 set the default adjustment coefficient B0 as the adjustment coefficient B to be used for the volume adjustment, and set the default adjustment time ΔT0 as the adjustment duration time when the source information A that matches with the source information A of the voice signal corresponding to the voice being output is not included in the adjustment information table. The adjustment-time setting unit 54 then starts the timer of the adjustment duration time. That is, the adjustment-time setting unit 54 starts counting until the set adjustment duration time elapses. The order of step S20 and step S22 is not limited to this order, but may be in arbitrary order.

Moreover, when a voice is not being output (step S12: NO), it proceeds to step S22, and the adjustment-time setting unit 54 sets the default adjustment time ΔT0 to the adjustment duration time. That is, when a voice is not being output, the volume adjustment is not necessary, and it is not necessary to set the adjustment coefficient B at this moment. However, even when a voice is not being output at this moment, because there is a possibility that a voice is to be output later, it is preferable to set the adjustment duration time to be prepared for that. Therefore, while the volume adjusting unit 42 does not set the adjustment coefficient B for the volume adjustment when a voice is not being output, the volume adjusting unit 42 sets the adjustment time ΔT as the adjustment duration time.

Having set the adjustment duration time at step S18 or step S22, the volume adjusting unit 42 turns ON an adjustment enable flag (step S24), and ends this processing.

Figure 5:
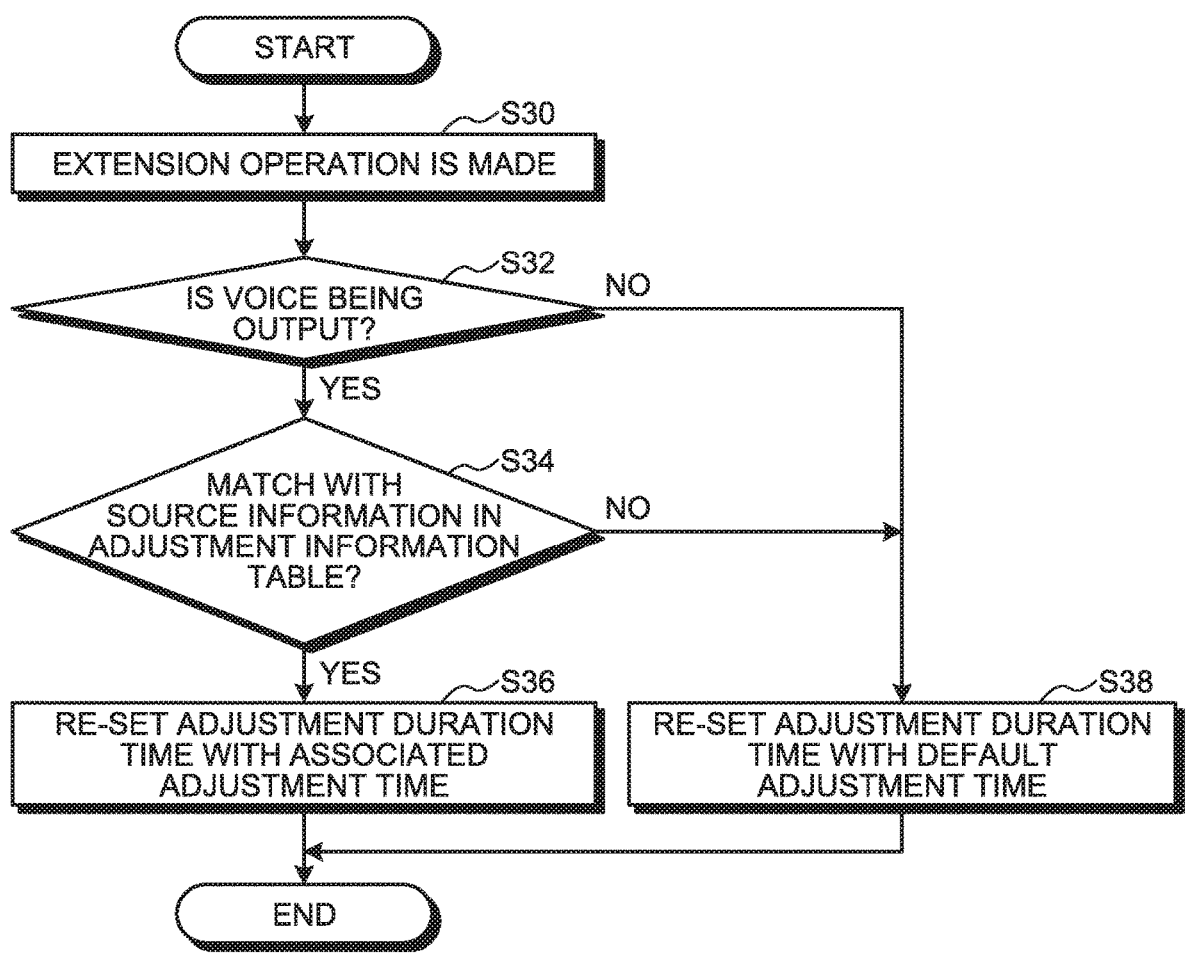
FIG. 5 is a flowchart explaining a method of extending the adjustment duration time.

Next, a method of extending the adjustment duration time by the volume adjusting unit 42 will be described. FIG. 5 is a flowchart explaining a method of extending the adjustment duration time. When an extension operation with respect to the switch 20D is detected during when the volume adjustment flag is ON, the volume adjusting unit 42 re-sets the adjustment duration time to extend the adjustment duration time. As illustrated in FIG. 5, when an extension operation is made with respect to the switch 20D during when the adjustment enable flag is ON (step S30), that is, when a volume-adjustment extension event occurs, the volume adjusting unit 42 detects that an extension operation is made. Having detected that the extension operation is made, the volume adjusting unit 42 determines whether a voice is being output from the output unit 16 (step S32). That is, the volume adjusting unit 42 determines whether the received voice signal is being output by the output unit 16 as a voice at the time when the extension operation is made with respect to the switch 20D. The extension operation is an operation (pressing) one time with respect to the switch 20D, but the extension operation is arbitrarily made.

When the voice is being output (step S32: YES), the volume adjusting unit 42 causes the source-information acquiring unit 50 to acquire the source information A of the voice signal being received, and determines whether the acquired source information A matches with the source information A in the adjustment information table (step S34). The volume adjusting unit 42 determines whether the source information A that matches with the source information A of the voice signal corresponding to the voice being output is present among the source information A included in the adjustment information table. When the matching source information A is present (step S34: YES), the volume adjusting unit 42 sets the adjustment time ΔT that is associated with the matching source information A by the adjustment-time setting unit 54 as the adjustment time ΔT to be used to re-set the adjustment duration time, and re-sets the adjustment duration time by using the adjustment time ΔT (step S36). That is, the adjustment-time setting unit 54 extracts the adjustment time ΔT that is associated with the source information A matching with the source information A of the voice signal corresponding to the voice being output in the adjustment information table. The adjustment-time setting unit 54 then extends the adjustment duration time currently set, by using the extracted adjustment time ΔT. In the present embodiment, the adjustment-time setting unit 54 changes time until the count of the timer of the adjustment duration time currently activated ends, from the time currently set to time of a period from the current time until a time at which the adjustment time ΔT extracted this time elapses.

On the other hand, when the matching source information A is not present (step S34: NO), the volume adjusting unit 42 causes the adjustment-time setting unit 54 to set the default adjustment time ΔT0 as the adjustment time ΔT to be used to re-set the adjustment duration time, and re-sets the adjustment duration time by using the default adjustment time ΔT0 (step S38). That is, the adjustment-time setting unit 54 extracts the default adjustment time ΔT0 when the source information A that matches with the source information A of the voice signal corresponding to the voice being output is not included in the adjustment information table. The adjustment-time setting unit 54 then extends the adjustment duration time currently set, by using the extracted default adjustment time ΔT0. That is, the adjustment-time setting unit 54 changes time until the count of the timer of the adjustment duration time currently activated ends, from the time currently set to time of a period from the current time until a time at which the default adjustment time ΔT0 elapses. Moreover, also when a voice is not being output (step S32: NO), it proceeds to step S38 similarly, and the adjustment duration time is re-set by using the default adjustment time ΔT0.

After the adjustment duration time is re-set at step S36 or step S38, the processing in FIG. 5 is finished. Note that as the volume adjustment flag is in the ON state in the processing in FIG. 5, the adjustment coefficient B has already been set when a voice is being output, and the adjustment coefficient B is not necessary to be set when a voice is not being output. Therefore, in the processing in FIG. 5, the adjustment coefficient B is not to be set. However, even in the processing in FIG. 5, if a voice is being output, the adjustment coefficient B may be re-set by a method similar to that in FIG. 4.

Having re-set the adjustment duration time, the volume adjusting unit 42 may cause the output unit 16 to output notification information, herein notification sound. That is, the volume adjusting unit 42 may notify the user that the volume adjustment is extended with the notification information.

Volume Adjustment

Next, a volume adjustment method by the volume adjusting unit 42 will be described. The volume adjusting unit 42 performs the volume adjustment of an output voice from the output unit 16 based on the adjustment coefficient B and the adjustment duration time set in FIG. 4 or FIG. 5. That is, the volume adjusting unit 42 converts the regular volume into an adjusted volume based on the adjustment coefficient B and the adjustment duration time, to cause the output unit 16 to output a voice in the adjusted volume. Hereinafter, it is specifically described.

Figure 6:
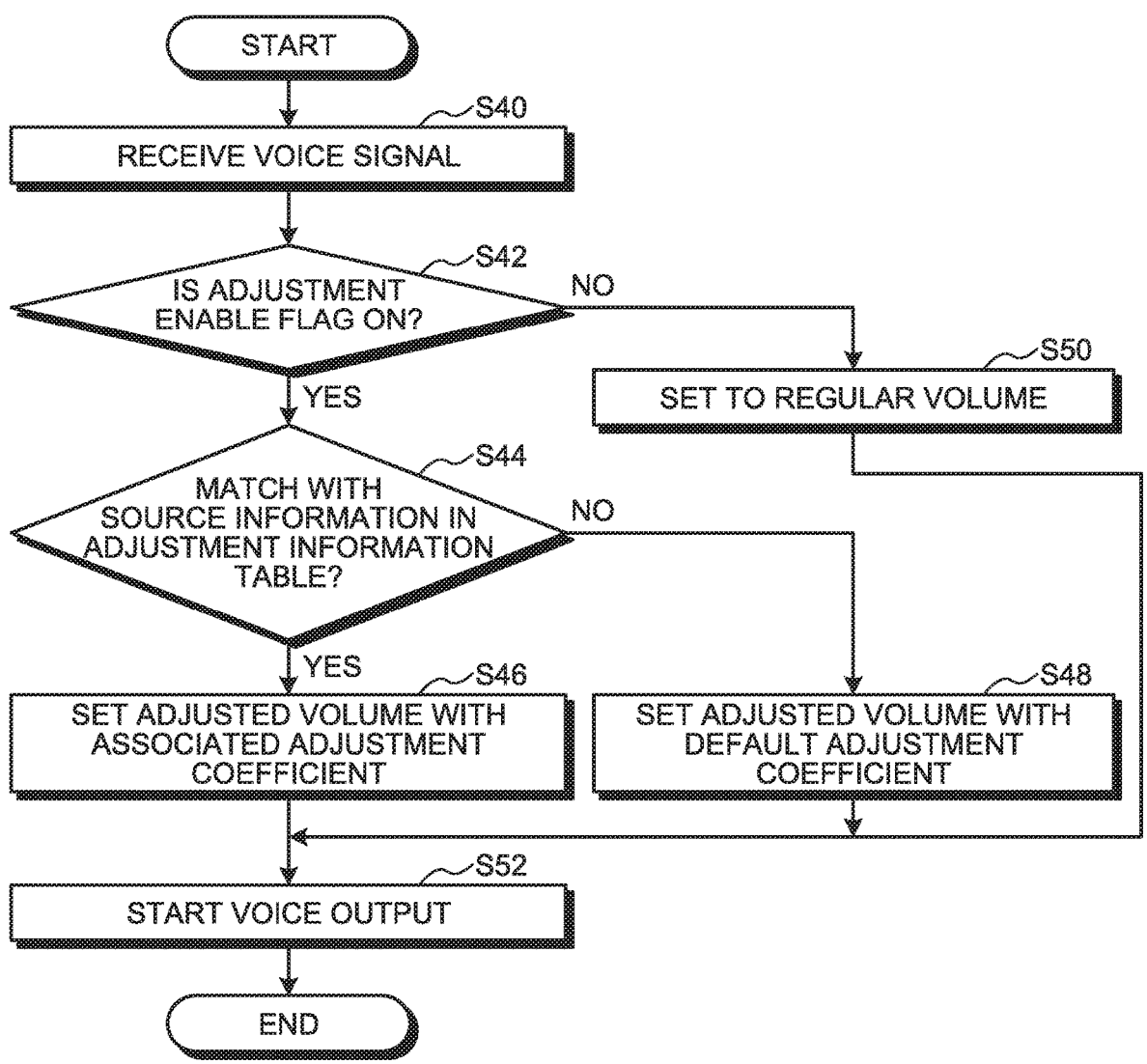
FIG. 6 is a flowchart explaining a volume adjustment method.

FIG. 6 is a flowchart explaining a volume adjustment method. As illustrated in FIG. 6, when a voice signal is received in the reception state (step S40), that is, when the reception signal is received in the reception state, the volume adjusting unit 42 determines whether the adjustment enable flag is ON (step S42). More specifically, the volume adjusting unit 42 determines whether the destination of the voice signal is the radio communication device 1 of itself, or whether the group of the destination of the voice signal includes the radio communication device 1 of itself from the destination information included in the received voice signal. The volume adjusting unit 42 determines whether the adjustment enable flag is ON at step S42 when the destination of the voice signal is the radio communication device 1 of itself, or when the group of destination of the voice signal includes the radio communication device 1 of itself. The volume adjusting unit 42 does not cause the output unit 16 to output a voice (mutes) when the destination of the voice signal is not the radio communication device 1 of itself, or when the group of destination of the voice signal does not include the radio communication device 1 of itself, and ends this processing.

When the adjustment enable flag is ON (step S42: YES), the volume adjusting unit 42 causes the source-information acquiring unit 50 to acquire the source information A of the voice signal being received, and determines whether the acquired source information A matches with the source information A of the adjustment information table (step S44). That is, the source-information acquiring unit 50 acquires the source information A of the received voice signal. The volume adjusting unit 42 determines whether the source information A that matches with the source information A of the received voice signal is present among the source information A included in the adjustment information table. When the matching source information A is present (step S44: YES), the volume adjusting unit 42 causes the adjustment-coefficient setting unit 52 to set the adjustment coefficient B that is associated with the matching source information A as the adjustment coefficient B to be used for the volume adjustment, and sets the adjusted volume by using the set adjustment coefficient B (step S46). In the present embodiment, the volume adjusting unit 42 sets a value acquired by multiplying the regular volume by the set adjustment coefficient B as the adjusted volume.

On the other hand, when the matching source information A is not present (step S44: NO), the volume adjusting unit 42 causes the adjustment-coefficient setting unit 52 to set the default adjustment coefficient B0 as the adjustment coefficient B to be used for the volume adjustment, and sets the adjusted volume by using the set adjustment coefficient B (step S48). In the present embodiment, the volume adjusting unit 42 sets a value acquired by multiplying the regular volume by the set adjustment coefficient B (default adjustment coefficient B0) as the adjusted volume.

As described, upon receiving a voice signal, the volume adjusting unit 42 sets the adjustment coefficient B when the adjustment enable flag is ON, and sets the adjusted volume by using the set adjustment coefficient B. That is, even when the adjustment enable flag is ON, the adjustment coefficient B has not been set at the time when the voice signal is received because voice output is not performed before the voice signal is received. For example, even if the adjustment coefficient B has been set prior to this moment, voice output using this adjustment coefficient B has been finished and, therefore, the adjustment coefficient B has been reset. Accordingly, the volume adjusting unit 42 sets the adjustment coefficient B for a received voice signal at the time when the voice signal is received, and sets the adjusted volume by using the set adjustment coefficient B. Note that when the adjustment enable flag is ON, even if previous voice output has been finished, the adjustment duration time is maintained to be set without being reset until time set as the adjustment duration time elapses. Therefore, the volume adjusting unit 42 does not perform setting of the adjustment duration time.

Moreover, when the adjustment enable flag is not ON (step S42: NO), that is, when the adjustment enable flag is OFF, the volume adjusting unit 42 sets the volume output from the output unit 16 to the regular volume (step S50). That is, when the adjustment enable flag is not ON, the volume adjustment is not performed.

After step S46, step S48, or step S50 is finished, the volume adjusting unit 42 causes the output unit 16 to output a voice by the volume control unit 56 (step S52). That is, when the adjusted volume is set at steps S46, S48, the volume control unit 56 sets a volume at the time of outputting the received voice signal as a voice by the output unit 16 to the adjusted volume, and causes the output unit 16 to output the voice in the adjusted volume. On the other hand, when the regular volume is set as a voice output by the output unit 16 at step S50, the volume control unit 56 sets the volume at the time of outputting the received voice signal as a voice by the output unit 16 to the regular volume, and causes the output unit 16 to output the voice in the regular volume. Thus, this processing is ended.

Note that the volume adjusting unit 42 may output notification information, herein notification sound, from the output unit 16 before outputting a voice from the output unit 16 in the adjusted volume. That is, the volume adjusting unit 42 may notify the user that the volume is adjusted, by the notification information when a voice is output, adjusting the volume.

Figure 7:
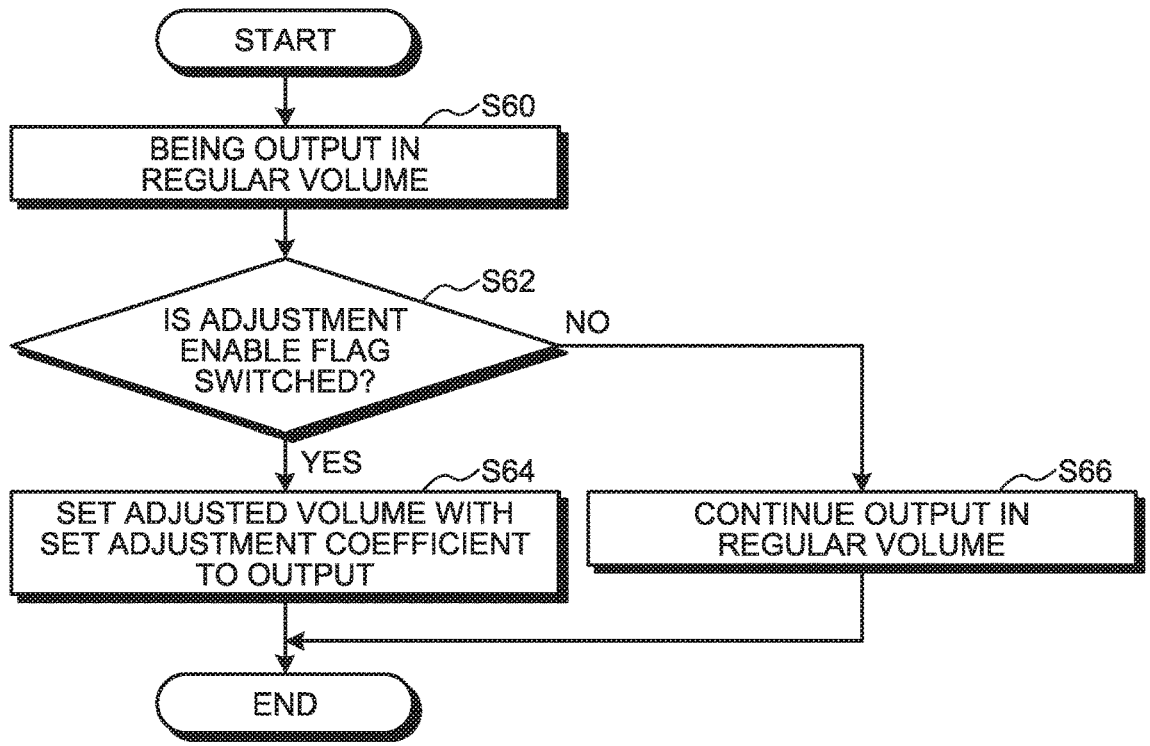
FIG. 7 is a flowchart explaining a volume adjustment method.

FIG. 7 is a flowchart explaining a volume adjustment method. FIG. 7 is to describe a volume adjustment method when the adjustment enable flag is switched to ON during a voice is being output in the regular volume. As illustrated in FIG. 7, when the adjustment enable flag is switched to ON (step S62: YES) during when the output unit 16 is outputting a voice in the regular volume (step S60), the volume adjusting unit 42 sets the adjusted volume with the adjustment coefficient B set at the time when the adjustment enable flag is switched to ON, and causes the output unit 16 to output a voice in the adjusted volume (step S64). The adjustment coefficient B set at the time when the adjustment enable flag is switched to ON is the adjustment coefficient B that is set at step S16 or step S20 in FIG. 4. On the other hand, when the adjustment enable flag is not switched to ON (step S62: NO), the volume adjusting unit 42 causes the output unit 16 to continue outputting a voice in the regular volume (step S66).

Figure 8:
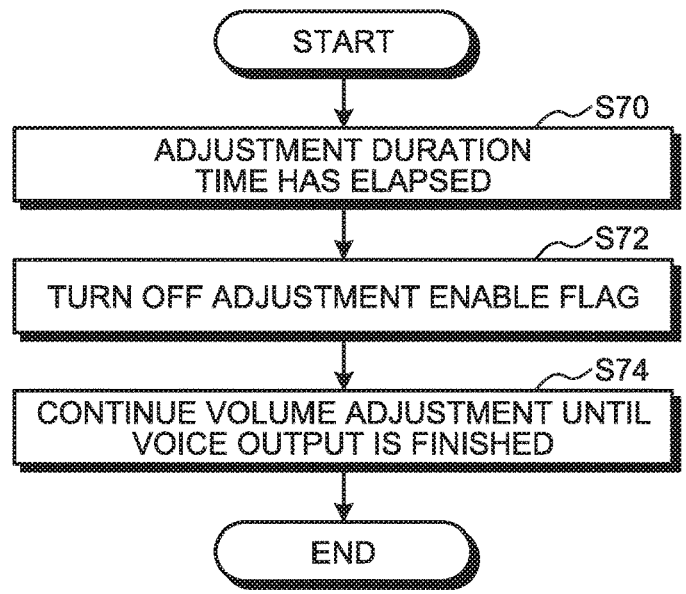
FIG. 8 is a flowchart explaining processing when the adjustment duration time has elapsed.
Figure 9:
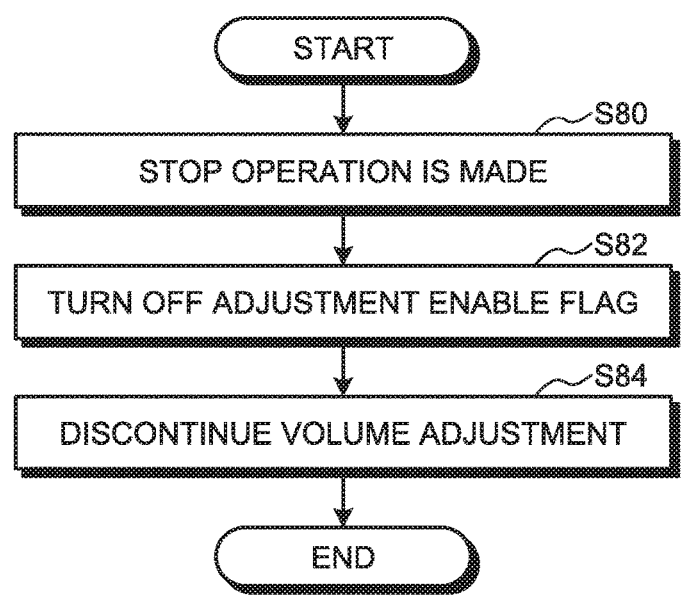
FIG. 9 is a flowchart explaining processing when a stop operation is performed.

Next, processing when the volume adjustment is ended will be described. FIG. 8 is a flowchart explaining processing when the adjustment duration time has elapsed, and FIG. 9 is a flowchart explaining processing when a stop operation is performed. As illustrated in FIG. 8, when the adjustment duration time has elapsed without a stop operation being performed during a voice is being output in the adjusted volume from the output unit 16, that is, during the volume adjustment (step S70), the volume adjusting unit 42 turns OFF the adjustment enable flag that has been ON (step S72). In other words, the volume adjusting unit 42 stops the timer, when the adjustment duration time set in the timer of the adjustment duration time has elapsed during the voice is being output in the adjusted volume, to turn off the adjustment enable flag. The volume adjusting unit 42 continues the volume adjustment until the voice output from the output unit 16 is finished (step S74), and ends the volume adjustment when the voice output is finished. That is, when the adjustment duration time elapses without a stop operation being made, the volume adjusting unit 42 continues the voice output in the adjusted volume until the voice output of the voice signal that is currently being output is finished.

On the other hand, as illustrated in FIG. 9, when a stop operation by the user is made during the voice is being output from the output unit 16 in the adjusted volume (step S80), that is, when the volume adjusting unit 42 detects the stop operation with respect to the switch 20E, the volume adjusting unit 42 stops the timer, and turns OFF the adjustment enable flag that has been ON (step S82). Note that the stop operation is an operation (pressing) one time with respect to the switch 20E, but the stop operation is arbitrarily made. The volume adjusting unit 42 then discontinues the volume adjustment (step S84), and controls to output the voice thereafter in the regular volume. That is, when the stop operation is made, the volume adjusting unit 42 switches from the voice output in the adjusted volume to the voice output in the regular volume irrespective of whether the adjustment duration time has elapsed or not. The volume adjusting unit 42 stops the timer and turns OFF the adjustment enable flag that has been ON, also when the adjustment duration time elapses while voice output is not performed, and when the stop operation is detected while voice output is not performed. Moreover, the volume adjusting unit 42 may output notification information, herein a notification sound, from the output unit 16 when the adjustment duration time has elapsed. That is, the volume adjusting unit 42 may notify the user that the adjustment duration time elapses and the volume adjustment is ended by the notification information. The notification information is not limited to be output at the time when the adjustment duration time elapses, but may be output at the time when output of a voice subjected to volume adjustment is finished.

Furthermore, the volume adjusting unit 42 may stop the volume adjustment when emergency information indicating that it is an emergency call is included in a voice signal. The emergency information is information included in a voice signal, and is added to the voice signal by the source as necessary. When the emergency information is extracted by the transception control unit 40 from the voice signal, the volume adjusting unit 42 acquires this emergency information, and stops the volume adjustment. A stop flow in this case is similar to the stop flow of the volume adjustment by the stop operation in FIG. 9. That is, it may be done by replacing the detection of stop information in FIG. 9 with acquisition of the emergency information. What has been described above is the setting method for volume adjustment.

Example of Volume Adjustment

Figure 10:
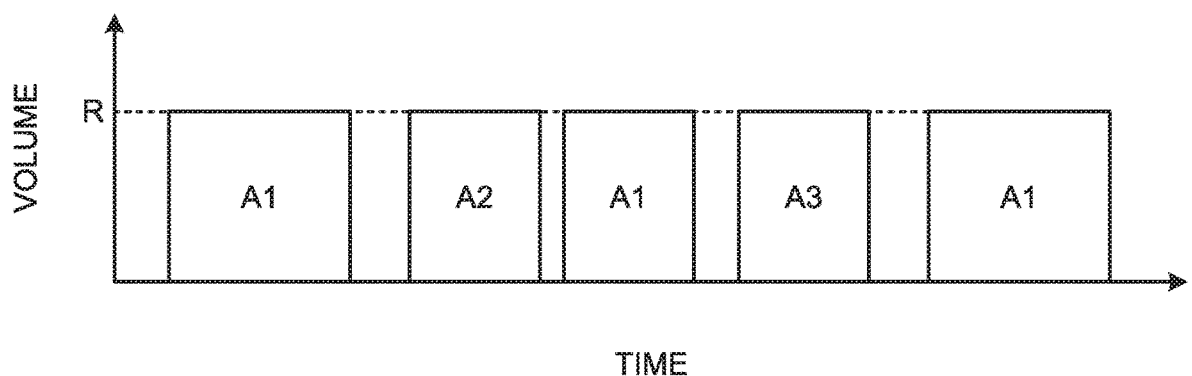
FIG. 10 is a diagram explaining an example of volume adjustment according to the present embodiment.
Figure 11:
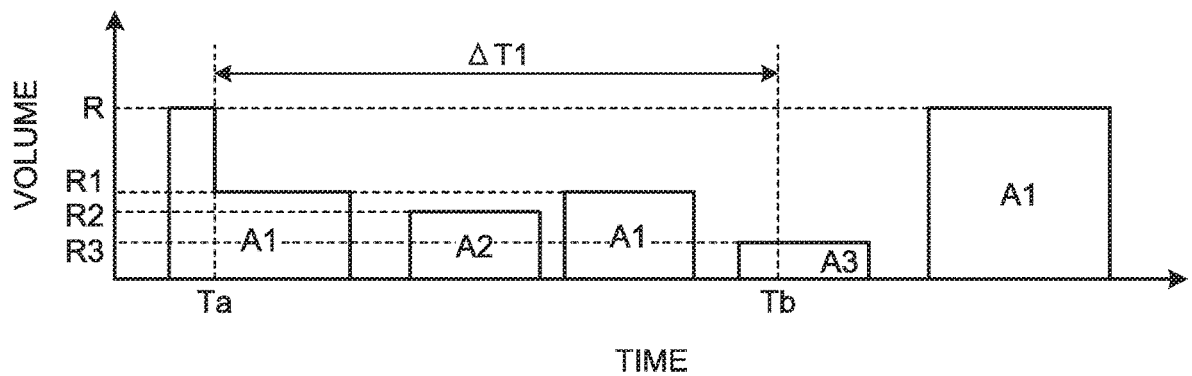
FIG. 11 is a diagram explaining an example of the volume adjustment according to the present embodiment.
Figure 12:
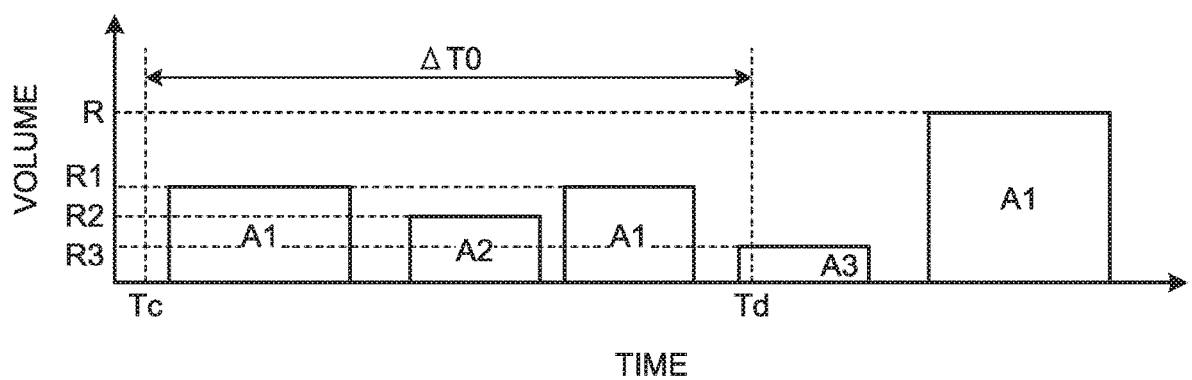
FIG. 12 is a diagram explaining an example of the volume adjustment according to the present embodiment.

Next, an example of the volume adjustment by using the volume adjustment method described above will be explained. FIG. 10 to FIG. 16 are diagrams explaining an example of the volume adjustment according to the present embodiment. In FIG. 10 to FIG. 16, a horizontal axis is for time, and a vertical axis is for a volume of a voice output by the output unit 16. FIG. 10 illustrates an example in which voice output is performed in the regular volume without performing the volume adjustment. FIG. 10 to FIG. 12 illustrate examples in which a voice signal of the source information A1 is first output, a voice signal of the source information A2 is then output, a voice signal of the source information A1 is then output, a voice signal of the source information A3 is then output, and a voice signal of the source information A1 is then output. In FIG. 10, because the volume adjustment is not performed, all of the volumes are a regular volume R.

FIG. 11 describes an example in which the volume adjustment is started at a time Ta during output of the first voice signal of the source information A1. That is, in FIG. 11, because an adjustment operation with respect to the switch 20C is detected at the time Ta, the volume adjusting unit 42 sets the adjustment coefficient B1 that is associated with the source information A1 as indicated at step S16 in FIG. 4, sets the adjustment time ΔT1 that is associated with the source information A1 to the adjustment duration time as indicated at step S18 in FIG. 4, and turns ON the adjustment enable flag. The volume adjusting unit 42 sets, at the time Ta, an adjustment volume R1 with the set adjustment coefficient B1 as indicated in step S64 in FIG. 7, to switch the voice output from the regular volume R to the adjusted volume R1. In the example in FIG. 11, the adjustment time ΔT1, that is, the adjustment duration time is applied to a period from the time Ta to a time Tb in which the voice signal of the source information A3 is being output. Therefore, after the output of the first voice signal of the source information A1 is finished, the voice signal of the source information A2 is output in an adjusted volume R2 set based on the adjustment coefficient B2, and the voice signal of the source information A1 thereafter is output in the adjusted volume R1. Moreover, because the adjustment duration time continues and the adjustment enable flag is ON even at the time when the voice signal of the source information A3 is started, the voice signal of the source information A3 is output in an adjusted volume R3 set based on the adjustment coefficient B3. Furthermore, because the adjustment duration time ends at the time Tb, the volume adjusting unit 42 turns OFF the adjustment enable flag as indicated at step S72 in FIG. 8. However, because the output of the voice signal of the source information A3 is being continued at the time Tb, the volume adjusting unit 42 continues the output in the adjusted volume R3 until the output of the voice signal of the source information A3 is finished. Because the adjustment enable flag is OFF, the voice signal of the source information A1 following the voice signal of the source information A3 is output in the regular volume R.

FIG. 12 illustrates an example in which the volume adjustment is started at a time Tc before the first voice signal of the source information A1 is output. That is, in FIG. 12, because the adjustment operation with respect to the switch 20C is detected at the time Tc, the volume adjusting unit 42 sets the default adjustment time ΔT0 to the adjustment duration time as indicated at step S22 in FIG. 4, and turns ON the adjustment enable flag. In the example in FIG. 12, the default adjustment time ΔT0, that is, the adjustment duration time is applied in a period from the time Tc to a time Td in which the voice signal of the source information A3 is being output. Therefore, the first voice signal of the source information A1, the voice signal of the source information A2, and the voice signal of source information A1 thereafter are output in the adjusted volumes R1, R2, R1 subjected to the volume adjustment. Moreover, similarly to the example in FIG. 11, because the output of the voice signal of the source information A3 is being continued at the time Td at which the adjustment duration time ends, the voice signal of the source information A3 is output in the adjusted volume R3 until the output is finished similarly to the example in FIG. 10. Because the adjustment enable flag is OFF, the voice signal of the source information A1 following the voice signal of the source information A3 is output in the regular volume R.

Figure 13:
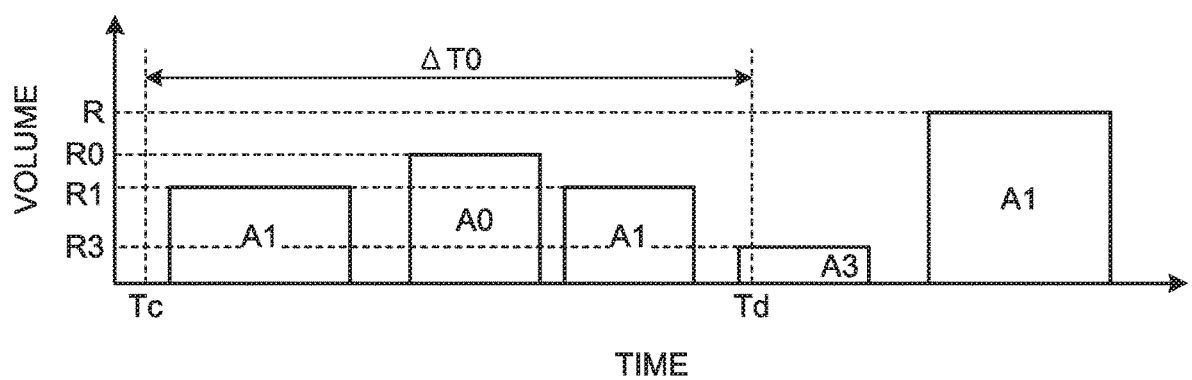
FIG. 13 is a diagram explaining an example of the volume adjustment according to the present embodiment.

FIG. 13 illustrates an example in which the second voice signal includes the source information A that is not included in the adjustment information table, and points other than that are the same as the example in FIG. 12. That is, FIG. 13 illustrates an example in which a voice signal of the source information A1 is first output, a voice signal of the default source information A0 is then output, the voice signal of a source information A1 is then output, a voice signal of the source information A3 is then output, and a voice signal of the source information A1 is then output. As illustrated in FIG. 13, because the second voice signal is the voice signal having the source information A that is not included in the adjustment information table, the default source information A0 is assigned. Accordingly, the second voice signal is output in an adjusted volume R0 that is set based on the default adjustment coefficient B0. In the present embodiment, the adjustment volume R0 is lower than the regular volume R, and is higher than the adjusted volumes R1, R2, R3 of the source information A included in the adjustment information table. That is, the default adjustment coefficient B0 is larger than the adjustment coefficient B (in this example, the adjustment coefficients B1, B2, B3) associated with the source information A included in the adjustment information table, and is smaller than 1. By thus setting, a volume from a source that is not registered in the adjustment information table can be set higher than a volume from a source that is registered in the adjustment information table and, therefore, it is possible to suppress the volume of an unknown source from being too low. Note that the default adjustment coefficient B0 is not limited to such a value, but can be arbitrarily set. The default adjustment time ΔT0 is also preferable to be longer than the adjustment time ΔT that is associated with the source information A included in the adjustment information table, but is not limited thereto and can be arbitrarily set.

Figure 14:
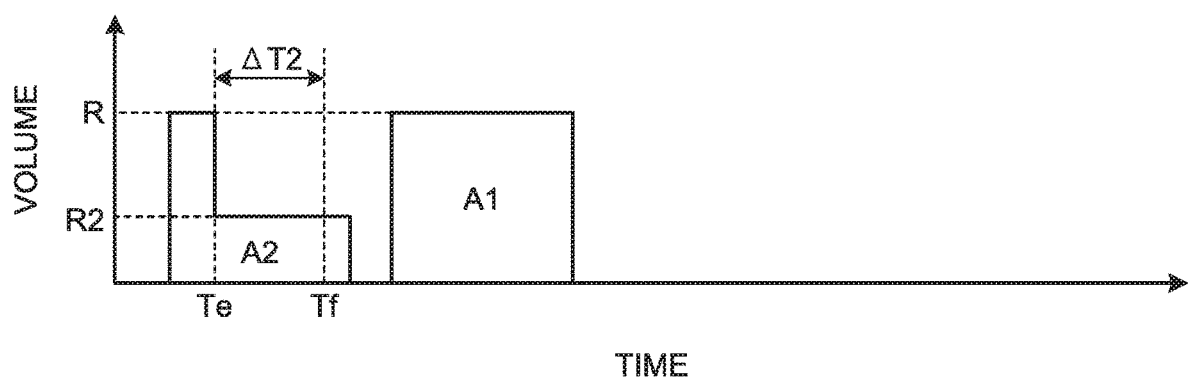
FIG. 14 is a diagram explaining an example of the volume adjustment according to the present embodiment.
Figure 15:
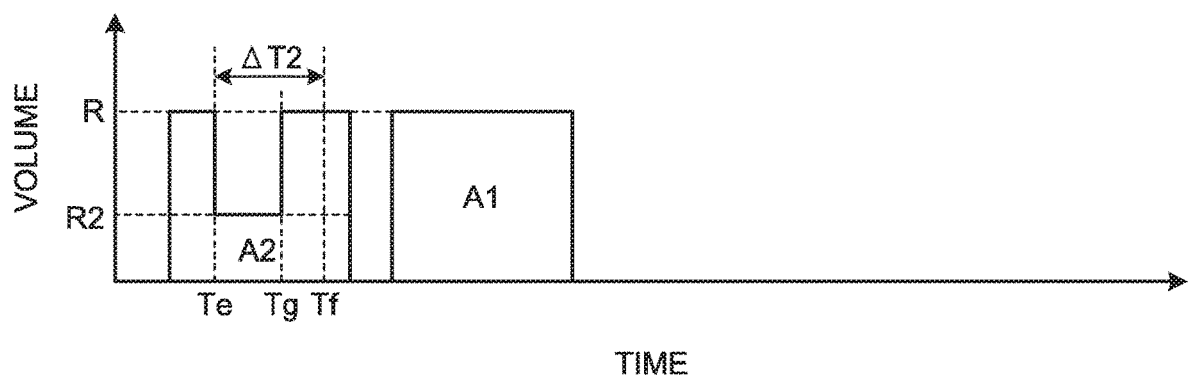
FIG. 15 is a diagram explaining an example of the volume adjustment according to the present embodiment.
Figure 16:
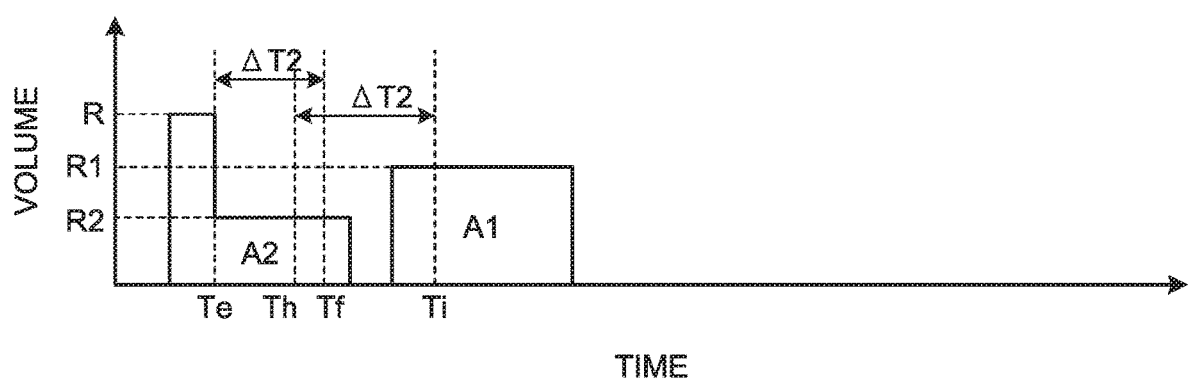
FIG. 16 is a diagram explaining an example of the volume adjustment according to the present embodiment.

FIG. 14 to FIG. 16 illustrate examples in which a voice signal of the source information A2 is first output and a voice signal of the source information A1 is then output. FIG. 14 illustrates an example in which the adjustment duration time has elapsed while a voice is being output, and a stop operation is not performed. The example in FIG. 14 illustrates an example in which the volume adjustment is started at a time Te during output of the voice signal of the source information A2. That is, in FIG. 14, because an adjustment operation with respect to the switch 20C is detected at the time Te, the volume adjusting unit 42 switches the volume of the voice signal of the source information A2 from the regular volume R to the adjusted volume R2 at the time Te. Moreover, the volume adjusting unit 42 sets the adjustment time ΔT2 that is associated with the source information A2 to the adjustment duration time. The adjustment time ΔT2, that is, the adjustment duration time is a period from the time Te to a time Tf during the output of the voice signal of the source information A2. Accordingly, the volume adjusting unit 42 turns OFF the adjustment enable flag at the time Te at which the adjustment duration time has elapsed, and continues the voice output in the adjusted volume R2 until the output of the voice signal of the source information A2 is finished. Because the adjustment enable flag is OFF, the following voice signal of the source information A1 is output in the regular volume R.

FIG. 15 illustrates an example in which a stop operation is made while a voice is being output. In the example in FIG. 15, the stop operation is performed at a time Tg between the time Te and the time Tf in a time period of the adjustment duration time. That is, in FIG. 14, because the stop operation with respect to the switch 20E is detected at the time Tg during output of the voice signal of the source information A2, the volume adjusting unit 42 turns OFF the adjustment enable flag at the time Tg, and switches the volume of the voice signal of the source information A2 from the adjusted volume R2 to the regular volume R.

FIG. 16 illustrates an example in which an extension operation is made. In the example in FIG. 16, the extension operation is performed at a time Th between the time Te and the time Tf in a time period of the adjustment duration time. That is, in the example in FIG. 16, because the extension operation with respect to the switch 20D is detected at the time Th during output of the voice signal of the source information A2, the volume adjusting unit 42 extends, at the time Th, the adjustment duration time with the adjustment time ΔT2 that is associated with the source information A2 as indicated at step S36 in FIG. 5. The adjustment duration time is extended from the time Th by the adjustment time ΔT2 to a time Ti. The time Ti is a time during output of the voice signal of the source information A1. Accordingly, the voice signal of the source information A1 is output in the adjusted volume R1 until the output is finished.

As described above, the radio communication device 1 according to the present embodiment is to perform radio communication by the press-to-talk communication system, and includes the operating unit 20 that receives an operation by the user, the output unit 16 that outputs a received voice signal as a voice, and the volume adjusting unit 42 that adjusts the volume of the voice output by the output unit 16. The volume adjusting unit 42 acquires the source information A indicating a source of the voice signal when a predetermined operation by the user is made with respect to the operating unit 20, and sets the adjustment coefficient B that is a degree of adjustment of the volume of the voice based on the acquired source information A, and adjusts the volume of the voice by using the set adjustment coefficient B. The radio communication device 1 adjusts the volume of the voice signal based on the source information A indicating the source of the received voice signal. Therefore, according to this radio communication device 1, the volume is not adjusted in the same way for voice signals of all sources, but the volume can be adjusted for each source, and the adjusted volume can be varied depending on a source. Therefore, according to this radio communication device 1, the volume control can be flexibly performed according to each source.

Moreover, the radio communication device 1 further includes the storage unit 34 that stores the adjustment information that is information in which the source information A and the adjustment coefficient B are associated with each other for each of plural sources. The volume adjusting unit 42 adjusts, when the source information A that matches with the source information A acquired from a received voice signal is included in the adjustment information, the volume of a voice by using the adjustment coefficient B that is associated with the matching source information A. This radio communication device 1 sets the adjustment coefficient B to perform the volume adjustment for each of the source information A in advance. Therefore, according to this radio communication device 1, the volume control can be flexibly performed according to each source. Furthermore, by setting the adjustment coefficient B for each of the source information A in advance, the volume adjustment according to a source can be appropriately performed in response to user needs. Note that the value of the adjustment coefficient B is variable.

Moreover, the volume adjusting unit 42 adjusts the volume by using the default adjustment coefficient B0 that is the predetermined adjustment coefficient B, when a predetermined operation (adjustment operation) by the user is made with respect to the operating unit 20, and the source information A that matches with the source information A of the received voice signal is not included in the adjustment information. According to this radio communication device 1, the volume adjustment is performed by using the default adjustment coefficient B0 and, therefore, even when a voice signal is received from a source that is not set in advance, the volume adjustment can be performed appropriately.

Furthermore, the storage unit 34 stores the adjustment time ΔT to set the adjustment duration time for which the volume adjustment of a voice is continued as the adjustment information, and the adjustment time ΔT is associated with the source information A. When the source information A that matches with the source information A of the received voice signal is included in the adjustment information, the volume adjusting unit 42 sets the adjustment duration time by using the adjustment time ΔT that is associated with the matching source information A. This volume adjusting unit 42 sets the adjustment duration time for which the volume adjustment is continued based on the adjustment time ΔT. By setting the adjustment duration time, it is enabled to continue the volume adjustment (keep the adjustment enable flag ON) until one voice output is finished and following voice output is started. Therefore, it becomes unnecessary to perform the adjustment operation each time a voice signal is received, and the volume adjustment is facilitated to be performed. Moreover, by setting the adjustment time ΔT for each source, time for which the volume adjustment is performed can be flexibly set according to a source. For example, when a voice signal is received from a source that has a tendency of sending signals, separating into several times, by setting the adjustment time ΔT to long in accordance with the tendency, a voice from the source separated into several times can be received in a state in which the volume adjustment is performed only with the operation performed once. Furthermore, by setting the adjustment duration time, it is possible to suppress the time of the volume adjustment from being too long.

Moreover, when a predetermined operation (adjustment operation) by the user is made with respect to the operating unit 20 at a time when a voice is being output from the output unit 16 and the matching source information A is included in the adjustment information, the volume adjusting unit 42 sets the adjustment duration time by using the adjustment time ΔT that is associated with the matching source information A, and starts the volume adjustment of the voice. The volume adjusting unit 42 sets the adjustment duration time by using the default adjustment time ΔT0, which is the adjustment time ΔT set in advance, when the adjustment operation by the user is made with respect to the operating unit 20 at a time when a voice is not being output from the output unit 16. This volume adjusting unit 42 sets the adjustment duration time by using the adjustment time ΔT set for each source when a voice signal is received from a source that has been registered in advance during voice output, and sets the adjustment duration time by using the default adjustment time ΔT0 when a voice signal is received during when a voice is not being output. Therefore, according to the radio communication device 1, time of the volume adjustment can be set appropriately according to a situation.

Furthermore, the volume adjusting unit 42 sets the adjustment duration time by using the default adjustment time ΔT0 when the matching source information A is not included in the adjustment information. Therefore, according to the radio communication device 1, even when a voice signal is received from a source that is not registered in advance, the volume adjustment can be performed appropriately.

Moreover, when the adjustment duration time has elapsed while the voice is being output from the output unit 16, the volume adjusting unit 42 continues the volume adjustment of a voice until the output of the voice is finished. Because the radio communication device 1 continues the volume adjustment until the voice ends, even when the adjustment duration time ends, it is possible to suppress increase of extension operation, and to set the volume adjustment easily.

Furthermore, the radio communication device 1 outputs notification information to notify that the adjustment duration time has elapsed, and the volume adjustment is to be ended. According to the radio communication device 1, because the user can be aware that the volume adjustment ends, the volume adjustment can be appropriately performed by making the adjustment operation again as necessary, or the like.

In the present embodiment, one adjustment coefficient B and one adjustment time ΔT are set for one piece of the source information A, but it is not limited thereto. That is, one adjustment coefficient B and one adjustment time ΔT may be set to plural pieces of the source information A. Moreover, plural adjustment coefficients B and plural adjustment times ΔT may be set for one piece of the source information A. In this case, the adjustment-coefficient setting unit 52 selects one of the adjustment coefficient B out of the plural adjustment coefficients B that are assigned to the source information A, as the adjustment coefficient B to be extracted. For example, the adjustment-coefficient setting unit 52 selects the adjustment coefficient B to be extracted based on an external environment of the radio communication device 1. For example, the adjustment-coefficient setting unit 52 may select the adjustment coefficient B having a higher value as the adjustment coefficient B to be extracted when a sound around the radio communication device 1 is larger than a predetermined value, that is, when a noise is large. Moreover, the adjustment-coefficient setting unit 52 may select the adjustment coefficient B having a large value as the adjustment coefficient B to be extracted when a sound around the radio communication device 1 is lower than a predetermined value, that is, when a noise is small. An external environment, herein an ambient sound, may be detected by a volume sensor that is equipped in the radio communication device 1. A method of selecting the adjustment coefficient B to be extracted is not limited thereto, but may be arbitrary. For example, the adjustment coefficient B may be selected by an operation of the user. Furthermore, even when plural adjustment times ΔT are set for one piece of the source information A, the adjustment-time setting unit 54 may select one of the adjustment time ΔT out of the plural adjustment times ΔT assigned to the source information A, as the adjustment time ΔT to be extracted.

According to the present disclosure, volume adjustment can be performed flexibly.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A radio communication device that performs radio communication by press-to-talk communication system, the radio communication device comprising:
   an operating unit that receives an operation by a user;
   an output unit that outputs a received voice signal as a voice;
   a volume adjusting unit that adjusts a volume of the voice that is output by the output unit; and
   a storage unit that stores adjustment information in which source information, an adjustment coefficient, and adjustment time are associated with one another, the source information indicating a source of the received voice signal, the adjustment coefficient indicating a degree of adjustment of the volume of the output unit, the adjustment time indicating adjustment duration time defining a period for which the adjustment coefficient is enabled, wherein
   the volume adjusting unit acquires the source information indicating the source of the received voice signal when a predetermined operation by the user is made with respect to the operating unit, and sets the adjustment duration time by using the adjustment time associated with the source information and starts a volume adjustment of the voice when the source information that matches with the source information acquired is included in the adjustment information, and
   adjusts the volume of the voice by using the adjustment coefficient associated with the source information when the source information that matches with the source information of the voice signal output as the voice from the output unit for a period of the adjustment duration time is included in the adjustment information.

2. The radio communication device according to claim 1, wherein
   when the predetermined operation by the user is made with respect to the operating unit at a time when the voice is not being output from the output unit, the volume adjusting unit sets the adjustment duration time by using a default adjustment time that is the adjustment time set in advance.

3. The radio communication device according to claim 1, wherein
   when the adjustment duration time ends while the voice is being output from the output unit, the volume adjusting unit continues the volume adjustment of the voice until output of the voice is finished.

4. The radio communication device according to claim 1, wherein
   when an extension operation by the user is made with respect to the operating unit during the adjustment duration time, the volume adjusting unit extends the adjustment duration time by using the adjustment time again.

5. A radio communication method to perform radio communication by a press-to-talk communication system by using an operating unit that receives an operation by a user, and a radio communication device that outputs a received voice signal as a voice, the radio communication method comprising:
   storing adjustment information in which source information, an adjustment coefficient, and adjustment time are associated with one another, the source information indicating a source of the received voice signal, the adjustment coefficient indicating a degree of adjustment of a volume of the voice output, the adjustment time indicating adjustment duration time defining a period for which the adjustment coefficient is enabled;
   acquiring the source information that indicates the source of the received voice signal when a predetermined operation by the user is made with respect to the operating unit, and sets the adjustment duration time by using the adjustment time associated with the source information and starts a volume adjustment of the voice when the source information that matches with the source information acquired is included in the adjustment information; and
   adjusting the volume of the voice by using the adjustment coefficient associated with the source information when the source information that matches with the source information of the voice signal output as the voice from the radio communication device for a period of the adjustment duration time is included in the adjustment information.

6. A non-transitory computer readable recording medium storing therein a computer program that causes a computer to execute a radio communication method for performing radio communication by a press-to-talk communication system by using an operating unit that receives an operation of a user, and a radio communication device that outputs a received voice signal as a voice, the program causing the computer to execute:
   storing adjustment information in which source information, an adjustment coefficient, and adjustment time are associated with one another, the source information indicating a source of the received voice signal, the adjustment coefficient indicating a degree of adjustment of a volume of the voice output, the adjustment time indicating adjustment duration time defining a period for which the adjustment coefficient is enabled;
   acquiring the source information that indicates the source of the received voice signal when a predetermined operation by the user is made with respect to the operating unit, and sets the adjustment duration time by using the adjustment time associated with the source information and starts a volume adjustment of the voice when the source information that matches with the source information acquired is included in the adjustment information; and
   adjusting the volume of the voice by using the adjustment coefficient associated with the source information when the source information that matches with the source information of the voice signal output as the voice from the radio communication device for a period of the adjustment duration time is included in the adjustment information.

* * * * *